(12) United States Patent
Wang et al.

(10) Patent No.: US 12,537,486 B2
(45) Date of Patent: Jan. 27, 2026

(54) AMPLIFIER WITH OUTPUT HARMONIC TERMINATION AND OUTPUT IMPEDANCE NETWORK

(71) Applicant: NXP USA, Inc., Austin, TX (US)

(72) Inventors: Yunfei Wang, Chengdu (CN); Tong Qiao, Chengdu (CN); Hongyu Xiang, Chengdu (CN)

(73) Assignee: NXP USA, Inc., Austin, TX (US)

( * ) Notice: Subject to any disclaimer, the term of this patent is extended or adjusted under 35 U.S.C. 154(b) by 447 days.

(21) Appl. No.: 18/170,390

(22) Filed: Feb. 16, 2023

(65) Prior Publication Data

US 2024/0178803 A1 May 30, 2024

(30) Foreign Application Priority Data

Nov. 30, 2022 (CN) .......................... 202211524477.0

(51) Int. Cl.
| | |
|---|---|
| *H03F 3/191* | (2006.01) |
| *H03F 1/08* | (2006.01) |
| *H03F 1/56* | (2006.01) |
| *H03F 3/193* | (2006.01) |

(52) U.S. Cl.
CPC ............. *H03F 3/193* (2013.01); *H03F 1/086* (2013.01); *H03F 1/565* (2013.01); *H03F 2200/222* (2013.01); *H03F 2200/451* (2013.01)

(58) Field of Classification Search
CPC ........................................................ H03F 3/191
USPC ................................................ 330/302, 305
See application file for complete search history.

(56) References Cited

U.S. PATENT DOCUMENTS

| | | | |
|---|---|---|---|
| 7,375,563 B1 | 5/2008 | Cheung et al. | |
| 9,692,373 B2 | 6/2017 | Staudinger et al. | |
| 10,587,226 B2* | 3/2020 | Ahmed | H03F 3/195 |
| 11,463,055 B2* | 10/2022 | Li | H03F 3/2171 |
| 11,705,872 B2* | 7/2023 | Roberts | H01L 23/66 |
| | | | 330/277 |
| 11,863,134 B2* | 1/2024 | Chen | H03F 3/245 |
| 12,132,453 B2* | 10/2024 | Roberts | H03F 1/565 |
| 2005/0018762 A1 | 1/2005 | Aiello et al. | |

(Continued)

OTHER PUBLICATIONS

Ramon Beltran et al.: "Lumped-element Output Networks for High-efficiency Power Amplifiers", 2010 IEEE MTT-S International Microwave Symposium, Anaheim, CA, USA, Date of Conference: May 23-28, 2010, 4 pages.

*Primary Examiner* — Henry Choe
(74) *Attorney, Agent, or Firm* — Andrew C. Milhollin (57) ABSTRACT

An amplifier device may include an amplifier transistor and having harmonic termination circuitry and an output impedance network, such as an output T network, coupled to the output of the amplifier transistor. The amplifier device may be configured as an inverted F class amplifier having an operational frequency range with a center frequency of less than or equal to around 2.6 GHz. The harmonic termination circuitry and output impedance network may be configured to create a short circuit or near short circuit at the amplifier transistor output for third harmonic frequencies of the center frequency of the amplifier transistor and to create an open circuit or near open circuit at the amplifier transistor output for second harmonic frequencies of the center frequency. The output impedance network may be configured to increase the output impedance at the center frequency and reduce signal loss for the amplifier device.

17 Claims, 3 Drawing Sheets

(56) References Cited

U.S. PATENT DOCUMENTS

2021/0175866 A1    6/2021  Li et al.
2021/0391829 A1*  12/2021  Srinidhi Embar ...... H03F 3/245

* cited by examiner

AMPLIFIER WITH OUTPUT HARMONIC TERMINATION AND OUTPUT IMPEDANCE NETWORK

CROSS-REFERENCE TO RELATED APPLICATIONS

This application claims the priority under 35 U.S.C. § 119 of Chinese patent application no. 202211524477.0, filed Nov. 30, 2022, the contents of which are incorporated by reference herein.

TECHNICAL FIELD

Embodiments of the subject matter described herein relate generally to power amplifiers, and, more specifically, to amplifiers with output harmonic termination circuitry and output impedance networks (e.g., output T networks).

BACKGROUND

Various wireless transmission systems use power amplifiers for increasing the power of a high frequency signal. In a wireless communication system, a power amplifier is usually the last amplifier in a transmission chain (i.e., the output stage). High gain, high linearity, stability, and a high level of efficiency—the ratio of radio frequency (RF) output power to direct current (DC) power—are characteristics of an ideal amplifier. Harmonic interference from harmonic frequencies of an amplifier's center frequency tend to reduce amplifier efficiency and contribute to signal loss. Termination of such harmonic frequencies at inputs or outputs of an amplifier is typically performed to improve amplifier performance.

SUMMARY

A brief summary of various exemplary embodiments is presented below. Some simplifications and omissions may be made in the following summary, which is intended to highlight and introduce some aspects of the various exemplary embodiments, without limiting the scope. Detailed descriptions of an exemplary embodiment adequate to allow those of ordinary skill in the art to make and use these concepts will follow in later sections.

In an example embodiment, an amplifier device may include a transistor having a first current terminal, a second current terminal, and a control terminal, an input coupled to the control terminal of the transistor, an output coupled to the first current terminal of the transistor, a reference potential coupled to the second current terminal of the transistor, at least one harmonic termination circuit coupled to the first current terminal of the transistor, and an impedance network. The impedance network may include a first inductor coupled between the first current terminal of the transistor and an intermediate node, a second inductor coupled between the output and the intermediate node, and a capacitor coupled between the intermediate node and the reference potential.

In one or more embodiments, the at least one harmonic termination circuit may include a second harmonic termination circuit including a first terminal coupled between the second inductor of the impedance network and the output, a second terminal coupled to the reference potential, and a series LC circuit coupled between the first terminal and the second terminal. The second harmonic termination circuit may be configured to have a resonance corresponding to a second harmonic of a center frequency of the amplifier device.

In one or more embodiments, the at least one harmonic termination circuit may include a third harmonic termination circuit that includes a third terminal coupled between the first inductor of the impedance network and first current terminal of the transistor, a fourth terminal coupled to the reference potential, and a series LC circuit coupled between the third terminal and the fourth terminal. The third harmonic termination circuit may be configured to have a resonance corresponding to a third harmonic of the center frequency of the amplifier device.

In one or more embodiments, the first inductor may include a first bond wire and the second inductor may include a second bond wire.

In one or more embodiments, a center frequency of the amplifier device may be less than or equal to 2.6 GHz.

In one or more embodiments, the amplifier device may be configured as an inverse class F amplifier device.

In one or more embodiments, the amplifier device may include an input harmonic termination circuit coupled to the control terminal of the transistor. The input harmonic termination circuit may be configured to have a resonance corresponding to a second harmonic of a center frequency of the amplifier device.

In an example embodiment, an amplifier package may include an active die that includes an amplifier transistor having a gate terminal, a source terminal, and a drain terminal, a first integrated passive device (IPD) die that includes a first plurality of capacitors and being coupled to the gate terminal via at least a first bond wire, a second IPD die that includes a second plurality of capacitors and being coupled to the drain terminal via at least a second bond wire and a third bond wire, an output conductor coupled to the second IPD die via at least a fourth bond wire and a fifth bond wire, a second harmonic termination circuit including the fourth bond wire and a first capacitor of the second plurality of capacitors disposed in the second IPD die, and an impedance network having a T configuration, the impedance network including the second bond wire, the fifth bond wire, and a second capacitor of the second plurality of capacitors of the second IPD die.

In one or more embodiments, the second harmonic termination circuit may have a resonance corresponding to a second harmonic of a center frequency of the amplifier transistor.

In one or more embodiments, the amplifier package may include a third harmonic termination circuit including the third bond wire and a third capacitor of the second plurality of capacitors of the second IPD die. The third harmonic termination circuit may have a resonance corresponding to a third harmonic of the center frequency of the amplifier transistor.

In one or more embodiments, the amplifier package may include a reference plane. The first capacitor, the second capacitor, and the third capacitor of the second plurality of capacitors of the second IPD die may be coupled to the reference plane.

In one or more embodiments, the amplifier package may include an input harmonic termination circuit that includes the first bond wire and a first capacitor of the first plurality of capacitors of the first IPD die. The first capacitor of the first plurality of capacitors of the first IPD die may be coupled to the reference plane, and the input harmonic termination circuit may have a resonance corresponding to the second harmonic of the center frequency of the amplifier transistor.

In an example embodiment, an amplifier device may include a transistor, the transistor having a gate terminal, a drain terminal, and a source terminal, an input coupled to the gate terminal of the transistor, an output coupled to the drain terminal of the transistor, a reference potential coupled to the source terminal of the transistor, at least one harmonic termination circuit coupled to the drain terminal of the transistor, and an impedance network having a T configuration coupled between the drain terminal of the transistor and the output.

In one or more embodiments, the impedance network may include a first inductor coupled between the drain terminal of the transistor and an intermediate node, a second inductor coupled between the output and the intermediate node, and a capacitor coupled between the intermediate node and the reference potential.

In one or more embodiments, the at least one harmonic termination circuit may include a second harmonic termination circuit that includes a first terminal coupled between the second inductor of the impedance network and the output, a second terminal coupled to the reference potential, and a series LC circuit coupled between the first terminal and the second terminal. The second harmonic termination circuit may be configured to have a resonance corresponding to a second harmonic of a center frequency of the amplifier device.

In one or more embodiments, the at least one harmonic termination circuit may include a third harmonic termination circuit that includes a third terminal coupled between the first inductor of the impedance network and drain terminal of the transistor, a fourth terminal coupled to the reference potential, and a series LC circuit coupled between the third terminal and the fourth terminal, wherein the third harmonic termination circuit is configured to have a resonance corresponding to a third harmonic of the center frequency of the amplifier device.

In one or more embodiments, the first inductor and the second inductor may be bond wires.

In one or more embodiments, a center frequency of the amplifier device may be less than or equal to 2.6 GHz.

In one or more embodiments, the amplifier device may be configured as an inverse class F amplifier device.

In one or more embodiments, the amplifier device may include an input harmonic termination circuit coupled to the gate terminal of the transistor, wherein the input harmonic termination circuit is configured to have a resonance corresponding to a second harmonic of a center frequency of the amplifier device.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

For the sake of brevity, conventional semiconductor fabrication techniques may not be described in detail herein. In addition, certain terms may also be used herein for reference only, and thus are not intended to be limiting. For instance, the terms "first", "second", and other such numerical terms referring to structures do not imply a sequence or order unless clearly indicated by the context.

Power amplifiers, such as those incorporated into wireless transmission systems, include one or more amplifier transistors configured to amplify the power of a high frequency signal to a level suitable for transmission. Harmonic interference from harmonic frequencies of signals amplified by an amplifier tend to reduce amplifier efficiency and contribute to signal loss. Termination of such harmonic frequencies at inputs or outputs of an amplifier is typically performed to improve amplifier performance. However, harmonic termination circuitry at the output of a power amplifier may degrade amplifier efficiency and cause undesirable radio frequency (RF) performance due to sensitivity and higher loss associated with such harmonic termination circuitry.

In accordance with various embodiments described herein, an example amplifier device may include an input, an output, an amplifier transistor having a control terminal (e.g., gate terminal), a first current terminal (e.g., a drain terminal), and a second current terminal (e.g., a source terminal), a second harmonic termination circuit, and an output impedance network coupled to the first current terminal of the amplifier transistor. The second harmonic termination circuit may include a series LC circuit coupled between the output and a reference potential (e.g., a "ground voltage" or "ground potential") and may be configured to resonate at the second harmonic of the center frequency of the amplifier device (e.g., the center frequency of the operating frequency band of the amplifier device). The output impedance network may have a T configuration (e.g., it may be a "T network") having a first inductor coupled between the first current terminal of the transistor and an intermediate node, a second inductor coupled between the output and the intermediate node, and a capacitor coupled between the intermediate node and the reference potential. In one or more embodiments, the amplifier device includes a third harmonic termination circuit including a series LC circuit coupled between the first current terminal of the amplifier transistor and the reference potential and configured to resonate at the third harmonic of the center frequency of the amplifier device. In one or more embodiments, the output impedance network is disposed between the transistor amplifier and the second harmonic termination circuit. In such embodiments, the output impedance network can reduce signal attenuation (e.g., including attenuation that would otherwise be attributable to the second harmonic termination circuit) and improve the Q factor of the amplifier device.

Additionally, conventional amplifier devices typically include a single series output inductance as part of the output impedance matching circuitry. However, for inverse class F amplifiers with operational frequency bands having center frequencies of less than around 2.6 GHz, this series output inductance would require an inductor with too large of a footprint to be reasonably manufacturable (e.g., given size constraints common in many modern RF power amplifier designs). By using a T network as the output impedance network instead of a series inductance to provide output impedance matching in conjunction with the second and/or third harmonic termination described above, embodiments of amplifier devices described herein have a comparatively smaller form factor for improved manufacturability (e.g., allowing the output impedance network to be implemented in-package).

Figure 1:
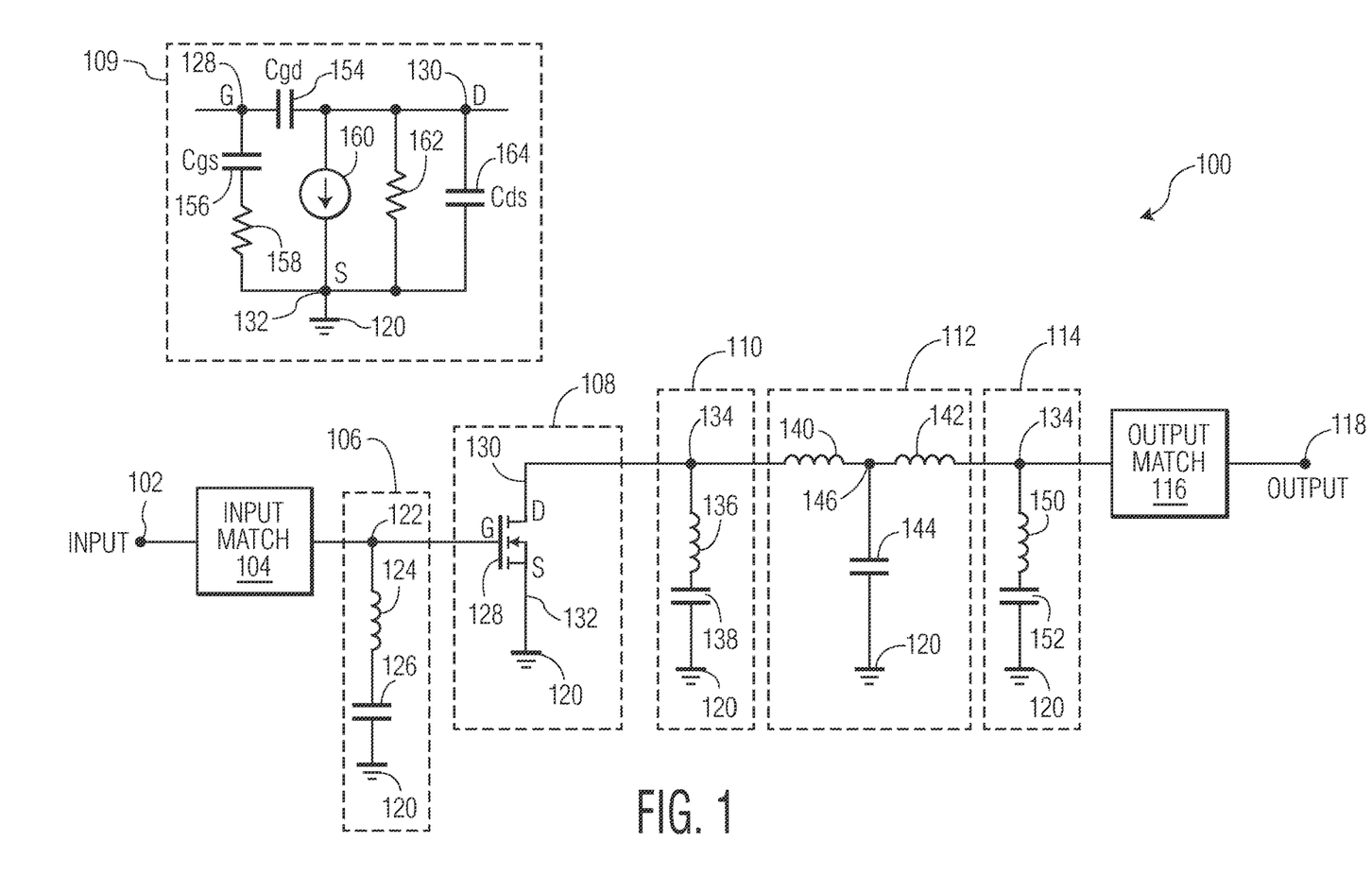
FIG. 1 is a block diagram of an example amplifier device that includes an amplifier transistor, harmonic termination circuitry, and an output impedance network having a T configuration, according to an embodiment.

FIG. 1 shows a circuit diagram of an example amplifier device 100 having output harmonic termination circuitry and a corresponding output matching network having a "T" configuration. The amplifier device 100 includes an input 102, input impedance matching circuitry 104, an input harmonic termination circuit 106, an amplifier transistor 108, a third harmonic termination circuit 110, an output impedance network 112 (sometimes referred to as an "output T network 112"), a second harmonic termination circuit 114, output impedance matching circuitry 116, and an output 118.

The amplifier transistor 108 may include a gate (G) terminal 128 (sometimes referred to as a "control terminal 128"), a drain (D) terminal 130 (sometimes referred to as a "first current terminal 130"), and a source (S) terminal 132 (sometimes referred to as a "second current terminal 132"). The amplifier transistor 108 may be a field-effect transistor (FET), such as a gallium nitride (GaN) FET, suitable for use, for example, in a radio frequency (RF) power amplifier circuit capable of operating at frequencies above about 400 megahertz (MHz), although other applicable transistor devices can be used, with or without modifications to the amplifier device 100, as will be understood by those of ordinary skill. The amplifier transistor 108 may be a power amplifier transistor having an inverse class F configuration, for example. Such power amplifier circuits may be employed, for instance, in a multi-carrier and/or single-carrier wireless base station. In one or more alternate embodiments, the amplifier transistor 108 is another type of III-V transistor (e.g., gallium arsenide (GaAs), gallium phosphide (GaP), indium phosphide (InP), or indium antimonide (InSb)), or another type of transistor that has a relatively low drain-source capacitance. In various embodiments, the substrate of amplifier device 100 in which amplifier transistor 108 is formed generally includes bulk or composite semiconductor materials (e.g., silicon (Si), gallium nitride (GaN), gallium arsenide (GaAs), silicon-on-insulator (SoI), silicon germanium (SiGe), GaN-on-insulator (e.g., GaN on Si, GaN on silicon carbide, GaN on sapphire, and so on), or other suitable materials).

An amplifier circuit 109 shows an example equivalent circuit for the amplifier transistor 108. As shown the amplifier circuit 109 includes the gate terminal 128, the drain terminal 130, the source terminal 132, a reference potential 120 coupled to the source terminal 132, a gate-source capacitance 156 and gate-source resistance 158 coupled in series between the gate terminal 128 and the source terminal 132, a current source 160 coupled between the drain terminal 130 and the source terminal 132, a drain-source resistance 162 coupled between the drain terminal 130 and the source terminal 132, a drain-source capacitance 164 coupled in parallel with each of the drain-source resistance 162 and the current source 160 between the drain terminal 130 and the source terminal 132, and a gate-drain capacitance 154 coupled between the gate terminal 128 and the drain terminal 130. The reference potential 120 may be a ground reference plane or direct current (DC) reference voltage supply, which may provide a ground voltage or a non-ground reference voltage, for example.

The input 102 of the amplifier device 100 is coupled to the gate terminal 128 of the amplifier transistor 108. In one or more embodiments, input signals (to be amplified) may be provided to the input 102 by an RF signal source (not shown). In one or more embodiments, input impedance matching circuitry 104 is coupled between the input 102 and the gate terminal 128. The input harmonic termination circuit 106 may be coupled to a node 122 disposed between the gate terminal 128 and the input 102. The input harmonic termination circuit 106 may include a series LC circuit that includes an inductor 124 coupled in series with a capacitor 126 between the node 122 and the reference potential 120. The input harmonic termination circuit 106 may have a resonance corresponding to a second harmonic of the center frequency of the amplifier device 100, such that second harmonics of the center frequency that may be present in input signals provided at the input 102 are effectively removed or reduced at the node 122, before reaching the gate terminal 128. Herein, the "center frequency" of a given amplifier refers to the center frequency of the operating bandwidth of the amplifier, unless indicated otherwise. The input impedance matching circuitry 104 may be configured to reduce the impedance mismatch between the amplifier transistor 108 and the RF signal source that may be coupled to the input 102.

The output 118 of amplifier device 100 may be coupled to the drain terminal 130 of the amplifier transistor 108. The source terminal 132 of the amplifier transistor 108 may be connected to the reference potential 120. RF signals received at the input 102 may be amplified by the amplifier transistor 108 to produce an amplified RF signal, which are then provided to the output 118. The output impedance network 112 may be coupled between the drain terminal 130 of the amplifier transistor 108 and the output 118. The output impedance matching circuitry 116 may be coupled between the output impedance network 112. The second harmonic termination circuit 114 may be disposed between the output impedance network 112 and the output impedance matching circuitry 116. The third harmonic termination circuit 110 may be disposed between the drain terminal 130 of the amplifier transistor 108 and the output impedance network 112.

The output impedance network 112 may be arranged in a T configuration (and is sometimes referred to as a "T network" or "output T network" herein). That is, the output impedance network 112 may correspond to a three-port T network. The output impedance network 112 may include an inductor 140 coupled between the drain terminal 130 and an intermediate node 146, an inductor 142 coupled between the intermediate node 146 and the output 118, and a capacitor 144 coupled between the intermediate node 146 and the reference potential 120. In one or more embodiments, the inductors 140 and 142 of the output impedance network 112 may be implemented using bond wires and the capacitor 144 may be implemented on an integrated passive device (IPD) die, as will be described in more detail below. The output impedance network 112 may be configured as an impedance transformer that increases the output impedance of the amplifier device 100 at the center frequency.

The second harmonic termination circuit 114 may be coupled to a node 148 disposed between the output impedance network 112 (e.g., the inductor 142 thereof) and the output 118. The second harmonic termination circuit 114 may include a series LC circuit that includes an inductor 150 coupled in series with a capacitor 152 between the node 148 and the reference potential 120. The second harmonic termination circuit 114 may have a resonance corresponding to a second harmonic of the fundamental frequency of the amplifier device 100, such that second harmonics of the in-band frequencies (sometimes referred to herein as "second harmonic signals") that may be present in amplified signals output by the amplifier transistor 108 are effectively removed or reduced at the node 148, before reaching the output 118. Herein, "in-band frequencies" refers to frequencies within the operating frequency band of a corresponding amplifier, unless indicated otherwise. The output impedance matching circuitry 116 may be configured to reduce the impedance mismatch between the amplifier transistor 108 and a load that may be coupled to the input 102.

The third harmonic termination circuit 110 may be coupled to a node 134 disposed between the drain terminal 130 of the amplifier transistor 108 and the output impedance network 112 (e.g., the inductor 140 thereof). The second harmonic termination circuit 114 may include a series LC circuit that includes an inductor 136 coupled in series with a capacitor 138 between the node 134 and the reference potential 120. The third harmonic termination circuit 110 may have a resonance corresponding to a third harmonic of the center frequency of the amplifier device 100, such that third harmonics of the in-band frequencies (sometimes referred to herein as "third harmonic signals") that may be present in amplified signals output by the amplifier transistor 108 are effectively removed or reduced at the node 134, before reaching the output 118.

The equivalent inductance of the output impedance network 112 and the intrinsic drain-source capacitance of the amplifier transistor 108 (e.g., the drain-source capacitance 164) in parallel with the equivalent capacitance of the third harmonic termination circuit 110 at the second harmonic frequency may form a parallel LC circuit that resonates around the second harmonic frequency, effectively creating a high impedance (e.g., open circuit or near-open-circuit) for second harmonic signals at the node 134. The series LC circuit (e.g., the inductor 136 and the capacitor 138) of the third harmonic termination circuit 110 may be configured to create a low impedance path to the reference potential 120 for third harmonic signals at the node 134. In this way, the node 134 at the drain terminal 130 of the amplifier transistor 108 may act as a short circuit or near-short-circuit for third harmonic signals and may act as an open circuit or near-open-circuit for second harmonic signals. In at least this way, the amplifier device 100 may be configured as an inverse class F amplifier, which generally requires third harmonic signals to be short and second harmonic signals to be open at the output (drain) of the amplifier transistor.

By providing the output impedance network 112 between the drain terminal 130 of the amplifier transistor 108 and the output 118, rather than, for example, a single series inductor, output impedance of the amplifier transistor 108 may be advantageously increased, the Q-factor of the amplifier circuit may be improved, and undesirable signal attenuation and corresponding the reduction in amplification efficiency over the operating frequency range of the amplifier circuit may be reduced advantageously.

In an example embodiment in which the center frequency of the amplifier device 100 is at or around 2.6 GHZ (such that the second harmonic frequency is around 5.2 GHz and the third harmonic frequency is around 7.8 GHZ), the inductor 136 may have an inductance of between 0.5 nH and 5 nH (e.g., around 1.05 nH), the capacitor 138 may have a capacitance of between 0.1 pF and 1 pF (e.g., around 0.4 pF), the inductor 140 may have an inductance of between 100 pH and 1 nH (e.g., around 400 pH), the inductor 142 may have an inductance of between 100 pH and 1 nH (e.g., around 300 pH), the capacitor 144 may have a capacitance of between 0.1 pF and 1 pF (e.g., around 0.6 pF), the inductor 150 may have an inductance of between 0.5 nH and 5 nH (e.g., around 1.5 nH), and the capacitor 152 may have a capacitance of between 0.1 pF and 1 pF (e.g., around 0.6 pF).

Figure 2:
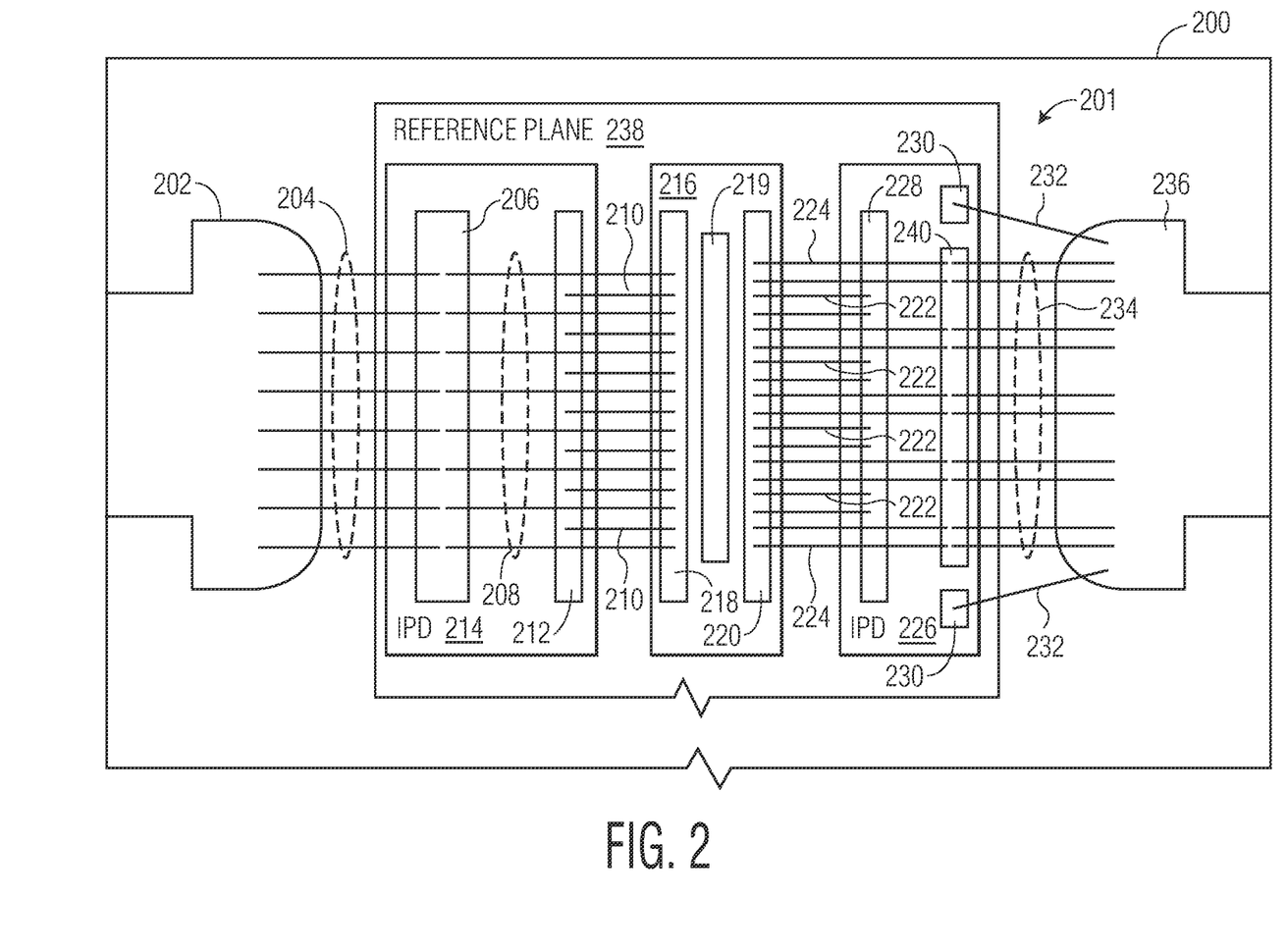
FIG. 2 is a top-down view of an example amplifier package that includes an amplifier device, such as the amplifier device of FIG. 1, implemented via an amplifier die and two integrated package device (IPD) die, according to an embodiment.

FIG. 2 shows an illustrative diagram of an amplifier package 200, which may house an amplifier device 201. In one or more embodiments, the amplifier device 201 corresponds to an example embodiment of the amplifier device 100 of FIG. 1. The amplifier package 200 may include an electrically conductive input lead 202, an electrically conductive output lead 236, and a reference plane 238. The amplifier device 201 may include an input IPD die 214, an active die 216, and an output IPD die 226.

In one or more embodiments, the input lead 202 may be coupled to an RF signal source (not shown). The RF signal source may be configured to provide RF signals for amplification to the amplifier device 201 via the input lead 202. The input lead 202 may be coupled to a bond pad 206 of the input IPD die 214 of the amplifier device 201 via bond wires 204. In one or more embodiments, the input lead 202 may correspond to the input 102 of FIG. 1.

The reference plane 238 of the amplifier package 200 may be biased to a reference potential, such as a ground voltage or a non-zero reference voltage. For example, the reference plane 238 may include a planar or substantially planar electrically conductive surface (e.g., formed from copper, gold, or another applicable electrically conductive material) on which the input IPD die 214, the active die 216, and the output IPD die 226 are disposed.

The input IPD die 214 may include multiple bond pads, such as bond pad 206 and bond pad 212. The bond pad 206 may be coupled to the input lead 202 via the bond wires 204. The bond pad 206 may be coupled to a bond pad 218 of the active die 216 via bond wires 208. The bond pad 212 may be coupled to the bond pad 218 of the active die 216 via at least one bond wire 210. The input IPD die 214 may include multiple passive components (e.g., capacitors, inductors, or resistors) formed thereon or integrally therewith. For example, the bond pad 212 of the input IPD die 214 may be coupled to the reference plane 238 via a capacitor (e.g., corresponding to the capacitor 126 of FIG. 1) that is formed on or integrally with the input IPD die 214, where the capacitor may form a series LC circuit with one or more of the bond wires 210 (e.g., corresponding to the inductor 124 of FIG. 1), such that the capacitor and the bond wires 210 act as an input harmonic termination circuit (e.g., the input harmonic termination circuit 106 of FIG. 1) for the amplifier device 201.

The active die 216 may include at one or more amplifier transistors 219, such as the amplifier transistor 108 of FIG. 1. In one or more embodiments, the active die 216 may include multiple amplifier transistors 219 arranged in parallel, with gate terminals of the amplifier transistors 219 coupled to the bond pad 218, drain terminals of the amplifier transistors 219 coupled to the bond pad 220, and source terminals of the amplifier transistors 219 coupled to the reference plane 238. The bond pad 220 may be coupled to a bond pad 240 of the output IPD die 226 via bond wires 224 and may separately be coupled to a bond pad 228 of the output IPD die 226 via at least one or more bond wires 222.

The output IPD die 226 may include multiple bond pads, such as bond pads 228, 230, and 240. The bond pad 228 may be coupled to the bond pad 220 of the active die 216 via the bond wires 222. The bond pad 240 may be coupled to the bond pad 220 of the active die 216 via the bond wires 224. The bond pad 240 may be coupled to the output lead 236 via bond wires 234. The bond pads 230 may be coupled to the output lead 236 via one or more bond wires 232.

The output IPD die 226 may include multiple passive components (e.g., capacitors, inductors, or resistors) formed thereon or integrally therewith. The passive components of the output IPD die 226 may include a first capacitor coupled between the bond pad 228 and the reference plane 238, such that the first capacitor is coupled in series with the bond wires 222 between the bond pad 220 of the active die 216 and the reference plane 238. The first capacitor and the bond wires 222 may be a series LC circuit, which may be configured to act as a third harmonic termination circuit, such as the third harmonic termination circuit 110 of FIG. 1. That is, in one or more embodiments, the first capacitor of the output IPD die 226 and the bond wires 222 may correspond to the capacitor 138 and the inductor 136, respectively, of the third harmonic termination circuit 110 of FIG. 1, described above. In such embodiments, the bond pad 220 may correspond to the node 134 of FIG. 1.

The passive components of the output IPD die 226 may include a second capacitor coupled between the bond pad 240 and the reference plane 238. The second capacitor, the bond wires 224, and the bond wires 234 may be a three-terminal T network, such as the output impedance network 112 of FIG. 1. That is, in one or more embodiments, the second capacitor of the output IPD die 226 may correspond to the capacitor 144 of the output impedance network 112, the bond wires 224 may correspond to the inductor 140 of the output impedance network 112, and the bond wires 234 may correspond to the inductor 142 of the output impedance network 112. In such embodiments, the bond pad 240 may correspond to the intermediate node 146 of FIG. 1.

The passive components of the output IPD die 226 may include a third capacitor (which may be implemented as two parallel capacitors in one or more embodiments) coupled between either or both of the bond pads 230 and the reference plane 238. The third capacitor may be coupled in series with one or more of the bond wires 232 between the output lead 236 and the reference plane 238 to form a series LC circuit, which may be configured to act as a second harmonic termination circuit, such as the second harmonic termination circuit 114 of FIG. 1. That is, in one or more embodiments, the third capacitor of the output IPD die 226 and the bond wires 232 may correspond to the capacitor 152 and the inductor 150, respectively, of the second harmonic termination circuit 114 of FIG. 1, described above. In such embodiments, the output lead 236 may correspond to the node 148 of FIG. 1.

In one or more embodiments, the output lead 236 may be coupled to a load, where amplified signals output by the amplifier device 201 may be provided to the load via the output lead 236. In one or more embodiments, the output lead 236 may be coupled to the load via output impedance matching circuitry, such as the output impedance matching circuitry 116 of FIG. 1.

By implementing the inductors of the three-port T network (e.g., the output impedance network 112 of FIG. 1) using the bond wires 224, 234 (rather than, say, spiral inductors or printed microstrip resonators), the Q-factor of the output impedance of the amplifier device implemented via the amplifier package 200 may be advantageously increased.

Figure 3:
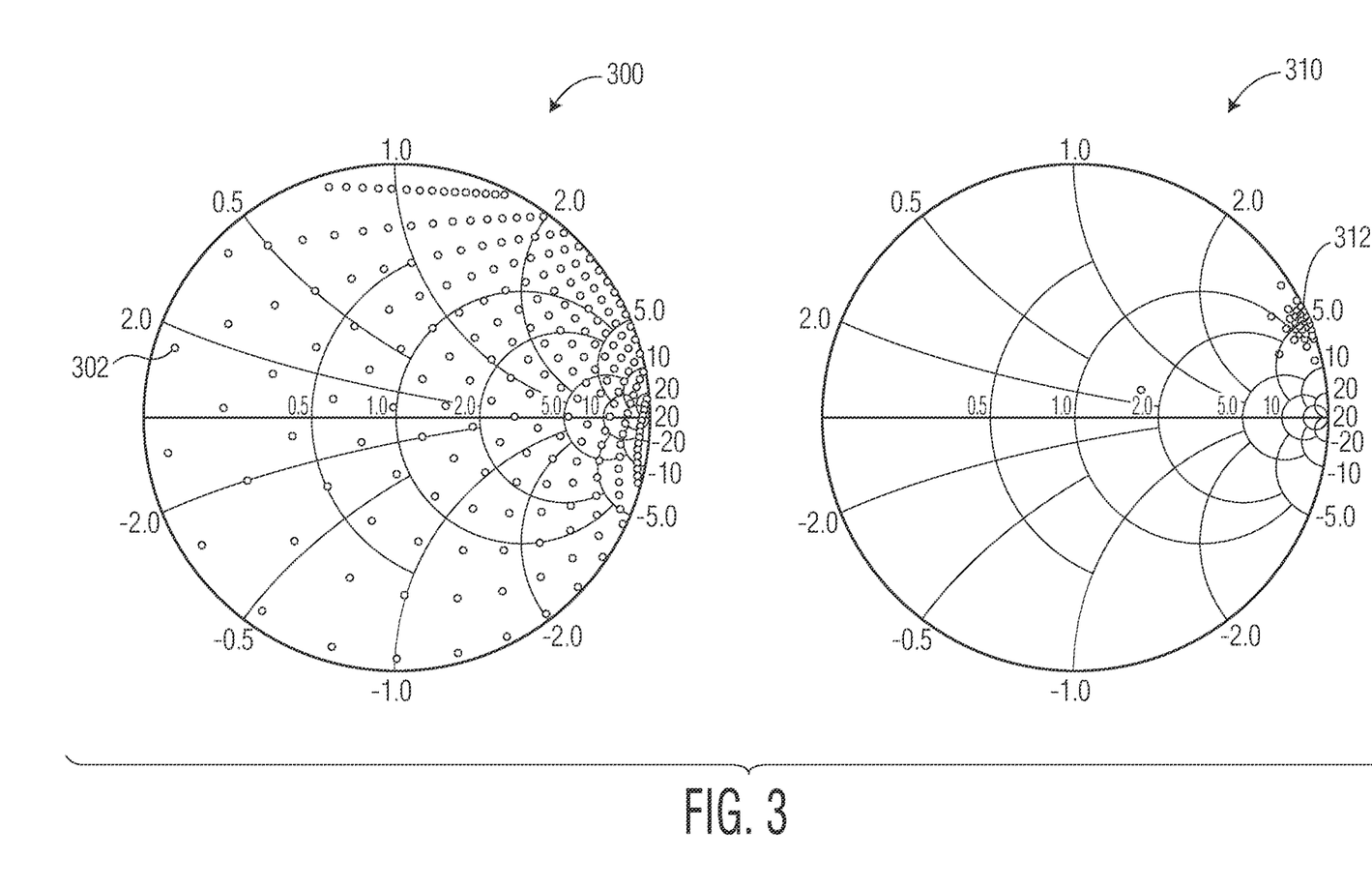
FIG. 3 shows Smith charts illustrating two examples of second harmonic impedance distributions with and without the harmonic termination circuitry and output impedance network shown in FIG. 1, according to an embodiment.

FIG. 3 shows an example Smith chart 300 illustrating the second harmonic impedance distribution for an amplifier device without output harmonic terminations or an output T network (sometimes referred to as the "conventional amplifier device") and an example Smith chart 310 illustrating second harmonic impedance distribution for an example embodiment of the amplifier device 100 of FIG. 1, including the output impedance network 112, the second harmonic termination circuit 114, and the third harmonic termination circuit 110. It should be noted that aspects of the Smith chart 310 may be described with reference to the amplifier device 100 of FIG. 1 in the present example.

In the Smith chart 300, for second harmonic signals and for a given distribution of complex load impedances for a load coupled to the output of the conventional amplifier device, the corresponding distribution of output impedances of the conventional amplifier device are represented by the points 302. As shown, the points 302 are distributed across the entire Smith chart 300, indicating that the output impedance of the conventional amplifier device at the second harmonic frequency is relatively uncontrolled.

In the Smitch chart 310, for second harmonic signals and for the same distribution of complex load impedances for a load coupled to the output 118 of the amplifier device 100, the corresponding distribution of output impedances of the amplifier device 100 are represented by the points 312. As shown, the points 312 are primarily located near the open circuit point on the Smith chart 310. It should be noted that the present example does not account for the intrinsic drain-source capacitance of the amplifier device 100 and, if that capacitance were accounted for, the distribution of output impedances represented by the points 312 would be closer to the open circuit point. As shown, the configuration and arrangement of at least the third harmonic termination circuit 110, the second harmonic termination circuit 114, and the output impedance network 112 may provide an open or near-open output impedance for second harmonic signals (e.g., at the node 134) across a wide range of load impedances. While not shown in the Smith chart 310, it should be understood that the third harmonic termination circuit 110 may be configured to provide a short or near-short output impedance for third harmonic signals (e.g., at the node 134).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program. The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random-access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments described herein may be implemented entirely in hardware or in an implementation containing both hardware and software elements. In embodiments which use software, the software may include but is not limited to firmware, resident software, microcode, etc.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier device comprising:
    a transistor having a first current terminal, a second current terminal, and a control terminal;
    an input coupled to the control terminal of the transistor;
    an output coupled to the first current terminal of the transistor;
    a reference potential coupled to the second current terminal of the transistor;
    at least one harmonic termination circuit coupled to the first current terminal of the transistor; and
    an impedance network comprising:
    a first inductor coupled between the first current terminal of the transistor and an intermediate node;
    a second inductor coupled between the output and the intermediate node; and
    a capacitor coupled between the intermediate node and the reference potential, wherein the at least one harmonic termination circuit comprises:
        a second harmonic termination circuit comprising:
            a first terminal coupled between the second inductor of the impedance network and the output;
            a second terminal coupled to the reference potential; and
            a series LC circuit coupled between the first terminal and the second terminal, wherein the second harmonic termination circuit is configured to have a resonance corresponding to a second harmonic of a center frequency of the amplifier device.

2. The amplifier device of claim 1, wherein the at least one harmonic termination circuit comprises:
    a third harmonic termination circuit comprising:
        a third terminal coupled between the first inductor of the impedance network and first current terminal of the transistor;
        a fourth terminal coupled to the reference potential; and
        a series LC circuit coupled between the third terminal and the fourth terminal, wherein the third harmonic termination circuit is configured to have a resonance corresponding to a third harmonic of the center frequency of the amplifier device.

3. The amplifier device of claim 1, wherein the first inductor includes a first bond wire and the second inductor includes a second bond wire.

4. The amplifier device of claim 1, wherein a center frequency of the amplifier device is less than or equal to 2.6 GHz.

5. The amplifier device of claim 1, wherein the amplifier device is configured as an inverse class F amplifier device.

6. The amplifier device of claim 1, further comprising:
    an input harmonic termination circuit coupled to the control terminal of the transistor, wherein the input harmonic termination circuit is configured to have a resonance corresponding to a second harmonic of a center frequency of the amplifier device.

7. An amplifier package comprising:
    an active die comprising an amplifier transistor having a gate terminal, a source terminal, and a drain terminal;
    a first integrated passive device (IPD) die comprising a first plurality of capacitors and being coupled to the gate terminal via at least a first bond wire;
    a second IPD die comprising a second plurality of capacitors and being coupled to the drain terminal via at least a second bond wire and a third bond wire;
    an output conductor coupled to the second IPD die via at least a fourth bond wire and a fifth bond wire;
    a second harmonic termination circuit comprising the fourth bond wire and a first capacitor of the second plurality of capacitors disposed in the second IPD die; and
    an impedance network having a T configuration, the impedance network comprising the second bond wire, the fifth bond wire, and a second capacitor of the second plurality of capacitors of the second IPD die.

8. The amplifier package of claim 7, wherein the second harmonic termination circuit has a resonance corresponding to a second harmonic of a center frequency of the amplifier transistor.

9. The amplifier package of claim 8, further comprising:
    a third harmonic termination circuit comprising the third bond wire and a third capacitor of the second plurality of capacitors of the second IPD die, wherein the third harmonic termination circuit has a resonance corresponding to a third harmonic of the center frequency of the amplifier transistor.

10. The amplifier package of claim 9, further comprising:
    a reference plane, wherein the first capacitor, the second capacitor, and the third capacitor of the second plurality of capacitors of the second IPD die are coupled to the reference plane.

11. The amplifier package of claim 10, further comprising:
an input harmonic termination circuit that includes the first bond wire and a first capacitor of the first plurality of capacitors of the first IPD die, wherein the first capacitor of the first plurality of capacitors of the first IPD die is coupled to the reference plane, and the input harmonic termination circuit has a resonance corresponding to the second harmonic of the center frequency of the amplifier transistor.

12. An amplifier device comprising:
a transistor, the transistor having a gate terminal, a drain terminal, and a source terminal;
an input coupled to the gate terminal of the transistor;
an output coupled to the drain terminal of the transistor;
a reference potential coupled to the source terminal of the transistor;
at least one harmonic termination circuit coupled to the drain terminal of the transistor; and
an impedance network having a T configuration coupled between the drain terminal of the transistor and the output, wherein the impedance network comprises a first inductor coupled between the drain terminal of the transistor and an intermediate node, a second inductor coupled between the output and the intermediate node, and a capacitor coupled between the intermediate node and the reference potential, and wherein the at least one harmonic termination circuit comprises:
a second harmonic termination circuit comprising:
a first terminal coupled between the second inductor of the impedance network and the output;
a second terminal coupled to the reference potential; and
a series LC circuit coupled between the first terminal and the second terminal, wherein the second harmonic termination circuit is configured to have a resonance corresponding to a second harmonic of a center frequency of the amplifier device.

13. The amplifier device of claim 12, wherein the at least one harmonic termination circuit comprises:
a third harmonic termination circuit comprising:
a third terminal coupled between the first inductor of the impedance network and drain terminal of the transistor;
a fourth terminal coupled to the reference potential; and
a series LC circuit coupled between the third terminal and the fourth terminal, wherein the third harmonic termination circuit is configured to have a resonance corresponding to a third harmonic of the center frequency of the amplifier device.

14. The amplifier device of claim 12, wherein the first inductor and the second inductor are bond wires.

15. The amplifier device of claim 12, wherein a center frequency of the amplifier device is less than or equal to 2.6 GHz.

16. The amplifier device of claim 12, wherein the amplifier device is configured as an inverse class F amplifier device.

17. The amplifier device of claim 12, further comprising:
an input harmonic termination circuit coupled to the gate terminal of the transistor, wherein the input harmonic termination circuit is configured to have a resonance corresponding to a second harmonic of a center frequency of the amplifier device.

* * * * *